United States Patent
Tamori

(10) Patent No.: US 7,817,426 B2
(45) Date of Patent: Oct. 19, 2010

(54) HEATSINK FOR HEAT-PRODUCING DEVICE

(75) Inventor: Isamu Tamori, Saitama (JP)

(73) Assignee: Tamura Corporation, Tokyo (JP)

( * ) Notice: Subject to any disclaimer, the term of this patent is extended or adjusted under 35 U.S.C. 154(b) by 69 days.

(21) Appl. No.: 12/384,303

(22) Filed: Apr. 2, 2009

(65) Prior Publication Data

US 2009/0251865 A1    Oct. 8, 2009

(30) Foreign Application Priority Data

Apr. 2, 2008    (JP) ............................. 2008-095666

(51) Int. Cl.
*H05K 7/20*    (2006.01)
*F28F 7/00*    (2006.01)
*H01L 23/34*    (2006.01)

(52) U.S. Cl. ...................... 361/704; 165/80.2; 165/185; 257/719; 361/707; 361/715; 361/719

(58) Field of Classification Search ......... 257/718–719; 361/715, 719
See application file for complete search history.

(56) References Cited

U.S. PATENT DOCUMENTS

| | | | |
|---|---|---|---|
| 5,225,965 A * | 7/1993 | Bailey et al. ................. | 361/704 |
| 5,274,193 A * | 12/1993 | Bailey et al. ................ | 174/16.3 |
| 5,327,324 A * | 7/1994 | Roth ........................... | 361/707 |
| 5,526,232 A * | 6/1996 | Kolberg et al. .............. | 361/715 |
| 5,742,478 A * | 4/1998 | Wu .............................. | 361/704 |
| 5,909,358 A * | 6/1999 | Bradt .......................... | 361/707 |
| 6,046,908 A * | 4/2000 | Feng ........................... | 361/707 |
| 6,081,424 A * | 6/2000 | Mach et al. .................. | 361/704 |
| 6,252,773 B1 * | 6/2001 | Werner ........................ | 361/704 |
| 7,660,114 B2 * | 2/2010 | Watanabe et al. ............ | 361/690 |
| 7,684,197 B2 * | 3/2010 | Zhu et al. .................... | 361/719 |

FOREIGN PATENT DOCUMENTS

JP    (U)60-167391    11/1985
JP    (U)7-29894    5/1995

* cited by examiner

*Primary Examiner*—Gregory D Thompson
(74) *Attorney, Agent, or Firm*—Day Pitney LLP

(57) ABSTRACT

There is provided a heatsink for radiating heat from a heat-producing device. The heatsink includes a heatsink body; a clip that has a pair of arms and is fitted to the heatsink body along a heat radiation surface of the heat-producing device such that the heat-radiation surface of the heat-producing device and the heatsink body closely contact with each other while being sandwiched between the pair of arms; and a guide plate integrally formed with the heatsink body. The guide plate is configured such that an interval between the guide plate and the heatsink body is smaller than an arm interval between the pair of arms of the clip on a front side in a fitting direction of the clip and is larger than the arm interval on a deep side in the fitting direction of the clip.

7 Claims, 8 Drawing Sheets

HEATSINK FOR HEAT-PRODUCING DEVICE

BACKGROUND OF THE INVENTION

The present invention relates to a heatsink for a heat-producing device, such as an MOS-FET used in an AC adapter to effectively radiate heat.

In an AC adapter, an electronic device capable of resisting a large amount of current, such as a switching regulator, is used. Since electronic devices of such a type are also regarded as heat-producing devices which produce a large amount of heat, many of such electronic devices are configured to employ a so-called TO-220 package which can be attached to a heatsink and has an excellent heat radiation property.

An outer appearance of an example of an electronic device employing a TO-220 package (an electronic device 100) is shown in FIG. 8. As shown in FIG. 8, the electronic device of the TO-220 package type includes a plate part 112, three lead terminals 114 extending from the lower edge of the plate part, and a heat radiation plate 116 embedded in a first surface 112a of the plate part 112. The heat radiation plate 116 is made of metal having a high degree of heat radiation property.

An edge of the heat radiation plate 116 forms a projected part 116a projected upward from the upper edge of the plate part 112. In the projected part 116a, a through hole 116b which penetrates from a first surface 116c (i.e., a front-side on FIG. 8 identical with the first surface 112a of the plate part 112) to a second surface 116d (i.e., a back-side on FIG. 8) of the heat radiation plate 116 is formed. By inserting a screw through the through hole 116b, it is possible to fix the heat radiation plate 116 to a heatsink.

Since the electronic device 100 of the TO-220 package type has the above described shape, each of the plate part 112 and the heat radiation plate 116 is mounted to stand vertically with respect to a substrate when the electronic device 100 is mounted on the substrate via the lead terminals 114.

As disclosed in each of Japanese Utility Model Provisional Publications No. HEI 7-29894 (hereafter, frequently referred to as JP HEI 7-29894U) and No. SHO 60-167391 (hereafter, frequently referred to as JP SHO 60-167391U), a heatsink has a plate-like metal heastsink body provided along the first surface 116c (i.e., the first surface 112a of the plate part) of the heat radiation plate 116, and a clip configured to have a U-shaped cross section to closely contact the first surface 116c of the heat radiation plate 116 with the heatsink body. When the heat radiation plate 116 is fixed to the heatsink body 116 with a screw, the outer size of the AC adapter inevitably increases because in this case a top of the screw or a nut is situated on the outside. Therefore, for an AC adapter required to be compact in size, it is preferable that the electronic device is fixed to the heatsink body with a clip as disclosed in the above described publications.

As disclosed in JP SHO 60-167391U, it is desirable to provide an insulative plate between the heat radiation plate 116 and the heatsink body so as to prevent an unexpected current from flowing between the heat radiation plate 116 and the heatsink body. A heat-conductive and insulative silicon sheet may be provided in place of the insulative plate in such a manner that the silicon sheet covers the first surface 116c, the top of the projected part 116a and the second surface 116d of the heat radiation plate 116 in a shape of a letter U.

When each electronic device is fixed to the heatsink body with a clip, the clip is widened by attaching a jig to the clip, and the clip is fitted to each electronic device arranged on the heatsink such that the electronic device and the heastsink are inserted into arms of the clip. Then, by removing the jig from the clip, the clip is closed. Since the interval between the arms of the clip is smaller than the thickness of the plate part 112 in a normal state, when the jig is removed from the clip, the electronic device 100 is firmly fixed to the heatsink body by an elastic force of the clip. As shown in FIG. 8, since a step part 118 is formed in the upper part of the electronic device 100 by the second surface 116d of the heat radiation plate 116 and the top face 112b of the plate part 112, the arms of the clip need to be widened sufficiently so that the tips of the arms of the clip is not caught on the step part 118.

SUMMARY OF THE INVENTION

As described above, the jigs are required for attaching a plurality of electronic devices to the heatsink body. Therefore, the man-hours increase due to work for attaching jigs to clips and removing the jigs from the clips. In addition, the jig needs to be formed such that the jug does not interfere other types of electronic components in the AC adapter. Therefore, there is a case where dedicated jigs are required for various types of components in the AC adapter, respectively.

If the jig drops off the clip accidentally in the state where the clip is not completely fitted to the heatsink body and the electronic device, a possibility that an impact force caused by elasticity of the clip is applied to the electronic device and thereby the electronic device is damaged arises. Furthermore, if the clip contacts the heat-conductive silicon sheet, the silicon sheet may be moved with movement of the clip when the clip is attached, and thereby the heat radiation plate and the heatsink body may contact with each other, or a hole is formed in the silicon sheet and thereby a creepage distance between the heat radiation plate and the heatsink body is shortened.

The present invention is advantageous in that it provides an heastsink enabling a heat-producing device to be attached to a heatsink body without using a jig.

According to an aspect of the invention, there is provided a heatsink for radiating heat from a heat-producing device. The heatsink includes a heatsink body; a clip that has a pair of arms and is fitted to the heatsink body along a heat radiation surface of the heat-producing device such that the heat-radiation surface of the heat-producing device and the heatsink body closely contact with each other while being sandwiched between the pair of arms; and a guide plate integrally formed with the heatsink body. The guide plate is configured such that an interval between the guide plate and the heatsink body is smaller than an arm interval between the pair of arms of the clip on a front side in a fitting direction of the clip and is larger than the arm interval on a deep side in the fitting direction of the clip.

Such a configuration makes it possible to widen the clip by the guide plate when the clip is fitted to the heatsink body and the heat-producing device. Therefore, it is possible to sandwich the heatsink body and the heat-producing device without using a jig.

In at least one aspect, the heatsink body is formed of a metal plate; and the guide plate is formed by folding a part of the heatsink body.

In at least one aspect, the guide plate is configured such that when the clip is fitted to the heatsink body and the heat-producing device, the guide plate is located between one of the pair of arms of the clip and a protection surface of the heat-producing device defined on a opposite side of the heat radiation surface, and does not contact the protection surface of the heat-producing device due to elastic deformation.

In at least one aspect, the heat-producing device has a first part and a second part thicker than the first part, the heat-producing device further has a step formed at a boundary between the first part and the second part on an opposite side of the heat radiation surface, the protection surface is defined on an opposite side of the first part of the heat-producing device, and when the heat-producing device is placed such that the first part faces the front side in the fitting direction of the clip, a top edge of the guide plate in the fitting direction is positioned close to a corner of the step of the heat-producing device.

In at least one aspect, the guide plate covers substantially an entire area defined on a opposite side of the heat-radiation surface in the first part of the heat-producing device.

In at least one aspect, the guide plate is formed by forming a notch in the heatsink body to have a form of a letter U and folding an inner part of the notch.

In at least one aspect, the heatsink body has a clip hole at a portion contacting a plate part of the heat-producing device, and the clip has an engagement projection which engages with the clip hole of the heatsink body in a state where the clip is fitted to the heatsink body.

BRIEF DESCRIPTION OF THE ACCOMPANYING DRAWINGS

DETAILED DESCRIPTION OF THE EMBODIMENTS

Hereinafter, an embodiment according to the invention is described with reference to the accompanying drawings.

Figure 1:
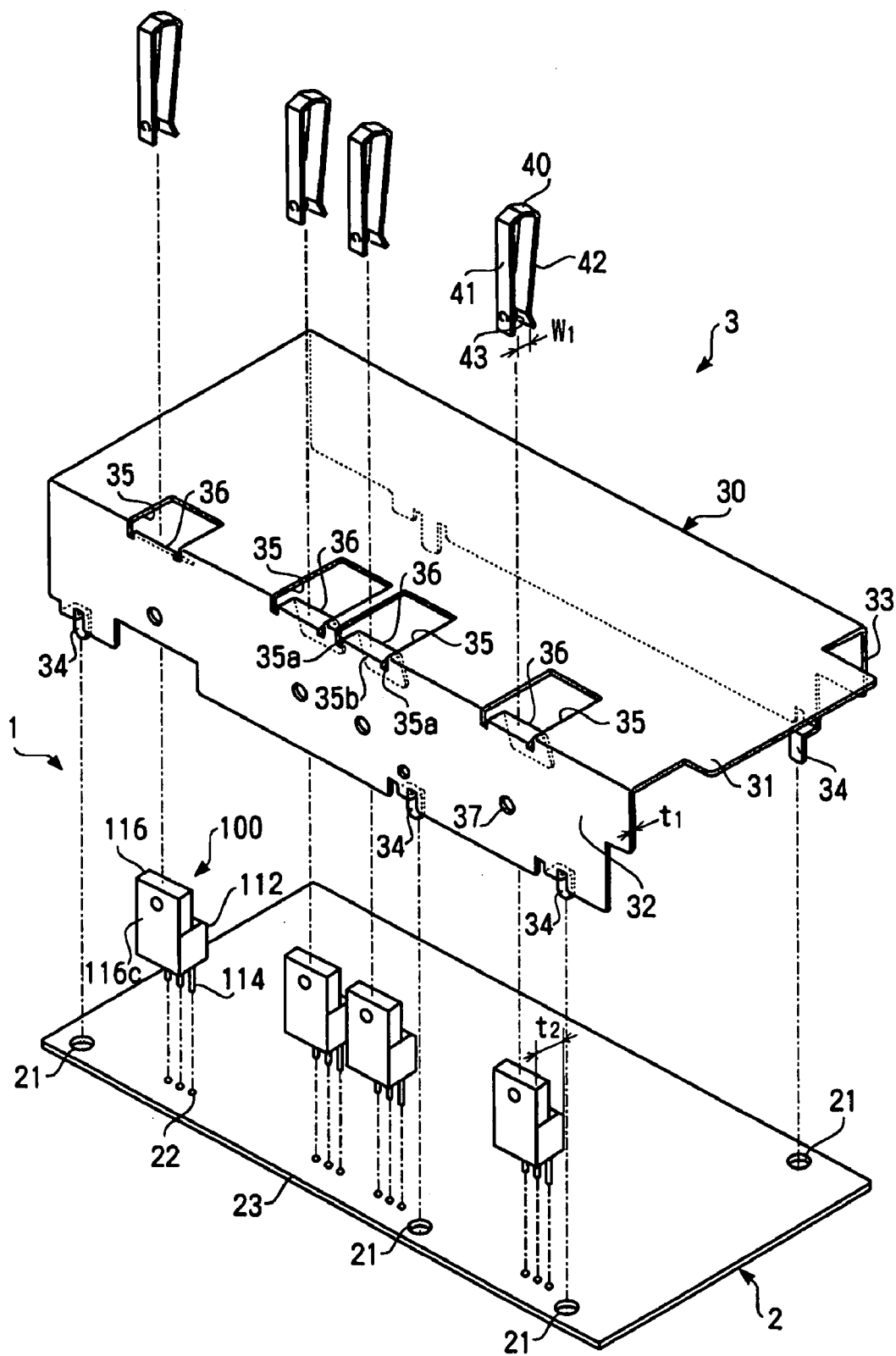
FIG. 1 is an exploded perspective view of an AC adapter according to an embodiment of the invention.

FIG. 1 is an exploded perspective view of an AC adapter according to an embodiment of the invention. In FIG. 1, a casing of the AC adapter is omitted so that a heatsink and electronic devices can be seen suitably. As shown in FIG. 1, the AC adapter 1 includes an AC-DC conversion board 2 and a heatsink 3.

The AC-DC conversion board 2 has a function of converting a two-phase alternating current inputted from an AC power cable (not shown) into a direct current having a predetermined voltage, and outputting the direct current to a DC power cable (not shown). The AC-DC conversion board 2 is provided with a plurality of registration holes 21 for attaching the heatsink 3, and connector holes 22 for connecting the lead terminals 114 of a switching regulator 100 for power conversion.

Figure 8:
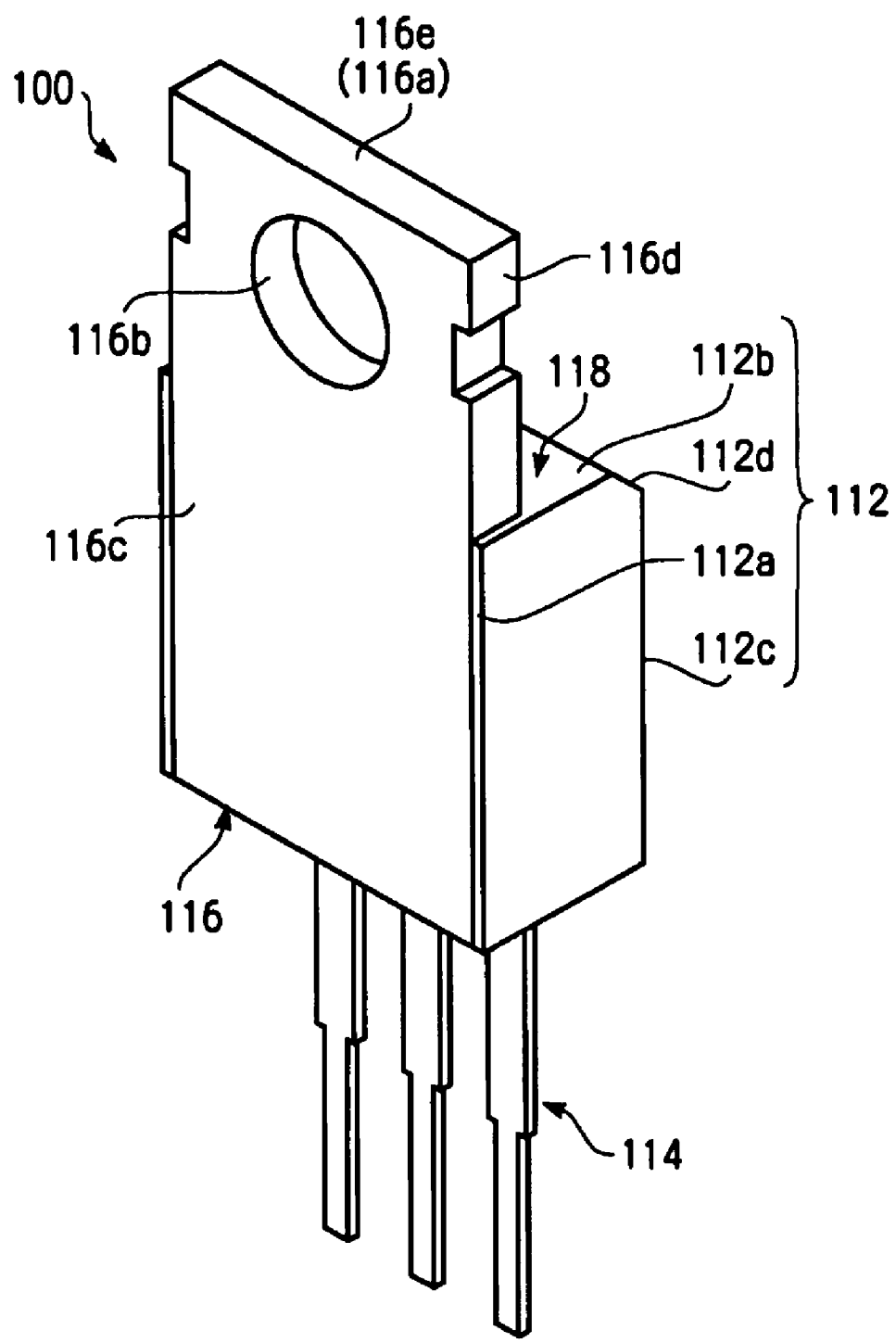
FIG. 8 is a perspective view of an electronic device of a TO-220 package used for the embodiment and in a conventional device.

The structure of the switching regulator 100 is explained with reference to FIG. 8. As shown in FIG. 8, the switching regulator 100 has a plate part 112, three lead terminals 114 extending from the lower edge of the plate part 112, and a heat radiation plate 116 embedded in a first surface 112a of the plate part 112. That is, the switching regulator 100 is an electronic device of a TO-220 package type. The heat radiation plate 116 is made of material including metal having a high degree of heat radiation property as a principal component.

An edge of the heat radiation plate 116 forms a projected part 116a projected upward from the upper edge of the plate part 112. In the projected part 116a, a through hole 116b which penetrates from a first surface 116c (i.e., a front-side on FIG. 8 identical with the first surface 112a of the plate part 112) to a second surface 116d (i.e., a back-side on FIG. 8) of the heat radiation plate 116 is formed. By inserting a screw through the through hole 116b, it is possible to fix the heat radiation plate 116 to a heatsink. However, as described below, according to the embodiment, the through hole 116b is not used because a clip 40 is used to closely contact the heat radiation plate 166 with the heastsink 3.

Since the switching regulator 100 has the above described structure, each of the plate part 112 and the heat radiation plate 116 is mounted on the board 2 to stand vertically with respect to the board 2 when the lead terminals 114 of the switching regulator 100 are inserted into the connector holes 22 and are soldered to the board 2.

The switching regulator 100 is an electronic device of a type through which a large amount of current flows, and therefore produces a large amount of heat. For this reason, the heatsink 3 is used to radiate heat from the switching regulator 100. As shown in FIG. 1, the heatsink 3 includes a heatsink body 30 and the clip 40. The heatsink body 30 is formed by bending a metal plate having a high heat-conductivity, such as iron or copper, to have a form of a letter U. The heastsink body 30 includes a top plate 31, a first side plate 32 and a second side plate 33. Each of the first and second side plates 32 and 33 is formed by bending each edge of the metal plate in the vertical direction.

At the lower edges of the first and second side plates 32 and 33, registration pins 34 are formed to protrude downward. The registration pins 34 are provided at positions corresponding to the registration holes 21 of the AC-DC conversion board 2. By attaching the heatsink body 30 to the AC-Dc conversion board 2 to insert the registration pins 34 to the registration holes 21, the top plate 31 covers entirely the top side of the AC-DC conversion board 2.

The connector holes 22 of the AC-DC conversion board 2 are aligned along a first edge 23 of the AC-DC conversion board 2. When the heatsink body 30 is attached to the AC-DC conversion board 2, the first side plate 32 of the heatsink body 30 is located along the first edge 23 of the AC-DC conversion board 2, and the first surface 116c of the heat radiation plate 116 of the switching regulator 100 mounted on the AC-DC conversion board 2 contacts the first side plate 32 of the heatsink body 30.

The clip 40 is a member for closely contacting the first surface 116c of the heat radiation plate 116 of the switching regulator 100 with an inner surface 32a of the first side plate 32 of the heatsink body 30. The clip 40 is a sort of a leaf spring formed by bending a slender metal plate to have a shape of a letter U. The clip 40 is configured to sandwich the plate part 112 of the switching regulator 100 and the first side plate 32 of the heatsink body 3 between a first arm 41 and a second arm 42.

The minimum interval $w_1$ of the first and second arms 41 and 42 at the lower portion of the clip 40 is smaller than the sum of the plate thickness $t_1$ of the heatsink body 30 and the thickness $t_2$ of the plate part 112 of the switching regulator 100. Therefore, when the clip 40 is fitted downward in the state where the first surface 116c of the heat radiation plate 116 contacts the inner surface 32a of the first side plate 32, the clip 40 serves to closely contact the first surface 116c and the inner surface 32a with respect to each other. In order that the clip 40 can be fitted from the upper side to the lower side, an opening 35 is formed in the top plate 31 of the heastsink body 30 for each switching regulator 100.

At the lower tip part of the first arm 41 of the clip 40, an engagement projection 43 protruding toward the second arm 42 is formed. In the first side plate 32 of the heatsink body 30, clip-catching holes 37 are formed. In this structure, by attaching the clip 40, the engagement projection 43 fits into the clip-catching hole 37. By the engagement between the engagement projection 43 and the clip-catching hole 37, the clip 40 is registered with respect to the heatsink body 30, and is firmly fixed.

The opening 35 forms a notch having a shape of a letter U extending from the top plate 31 to the first side plate 32. The opening 35 is formed by bending the notched part downward. The downwardly bent part forms a guide plate 36. More specifically, as shown in FIG. 1, two tips 35a and 35a of the notch having the shape of a letter U are situated on the first side plate 32. By folding the inner part of the notched part along a fold 35b connecting the two tips 35a and 35a with each other, the guide plate 36 facing the first side plate 32 on the lower side of the top plate 31 can be formed. The guide plate 36 serves to protect the second arm 42 of the clip 40 from contacting the second surface 116d (i.e., a protection surface) of the heat radiation plate 116 when the clip 40 is attached to the switching regulator 100, and to widen the interval $w_1$ of the arms of the clip 40 so that the clip 40 can attached without using a jig.

Figure 2:
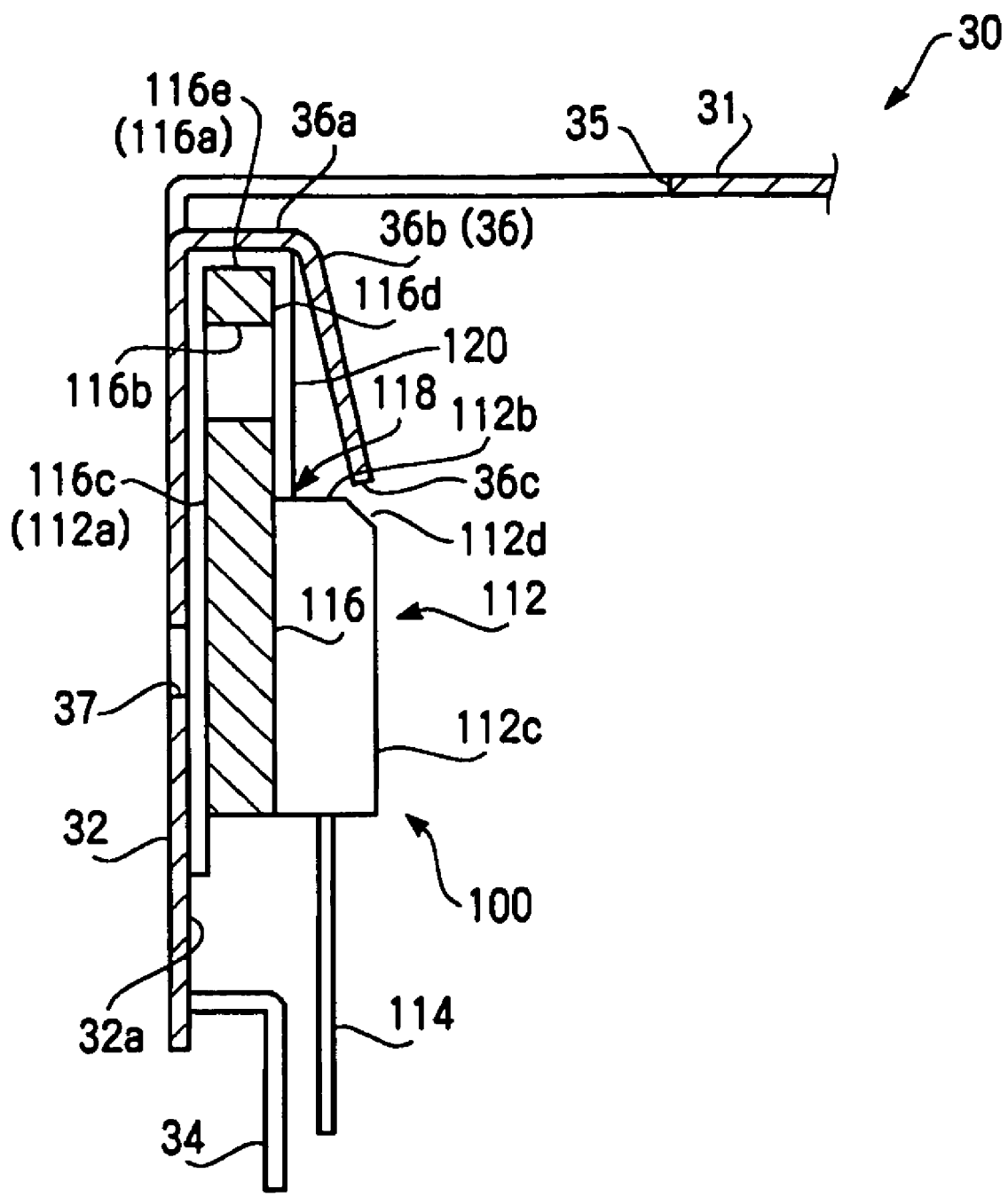
FIG. 2 is a side cross section of a heatsink body and a switching regulator in the vicinity of a guide plate.

Next, the guide plate 36 is explained in detail. FIG. 2 is a side cross section of the heatsink body 30 and the switching regulator 100 in the vicinity of the guide plate 36. As shown in FIG. 2, the guide plate 36 has a first part 36a extending horizontally along a top edge 116e of the projected part 116a of the heat radiation plate 116, and a second part 36b extending downward in a slanting direction to cover the second surface 116d of the heat radiation plate 116. An edge 36c of the second part 36b of the guide plate 36 is positioned close to a corner part 112d formed by the top face surface 112b and the second surface 112c of the plate part 112 of the switching regulator 100.

In order that the metal heat radiation plate 116 and the metal heatsink body 30 are prevented from directly contacting with each other, a heat-conductive silicon sheet 120 is adhered to cover the first surface 116c, the top edge 116e and the second surface 116d of the heat radiation plate 116.

Figure 3:
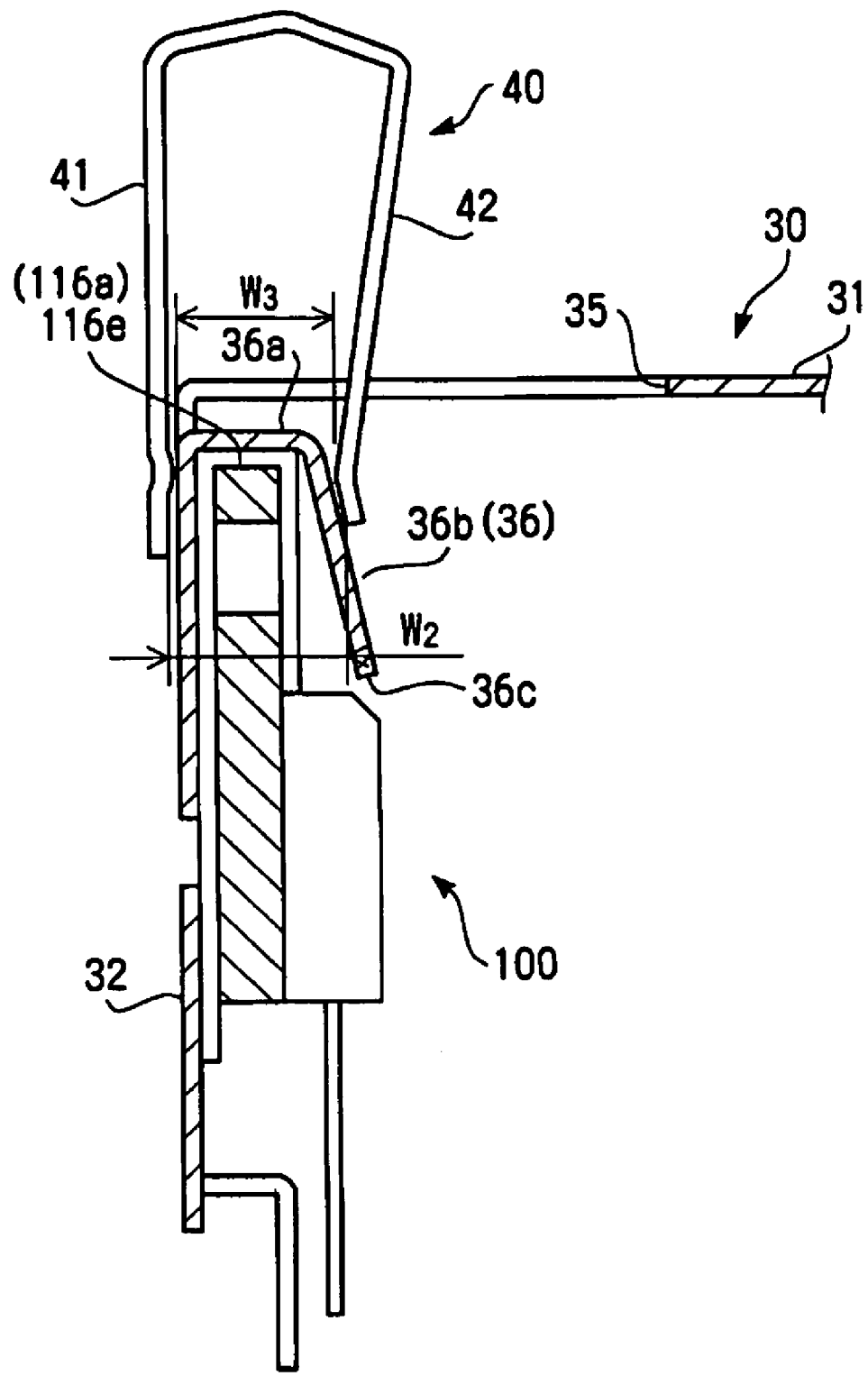
FIG. 3 is a side cross section illustrating a situation where a clip is fitted to the heatsink body and the switching regulator in the vicinity of a guide plate.

Hereafter, a process for attaching the clip 40 to the heatsink body 30 and the switching regulator 100 will be explained. To attach the clip 40, the switching regulator 100 to which the heat-conductive silicon sheet 120 has been adhered is placed between the guide plate 36 and the first side plate 32 in advance as shown in FIG. 2. Next, as shown in FIG. 3, the clip 40 is fitted such that the tip of the second arm 42 enters the inside of the heatsink body 30 through the opening 35, and the tip of the first arm 41 contacts the outer surface of the first side plate 32. In this embodiment, the interval $w_2$ of the first and second arms 41 and 42 at the lower edge part of the clip 40 is larger than the width $w_3$ of the first part 36a of the guide plate 36 in a natural condition. Therefore, when the clip 40 is fitted to the guide plate 36, the second arm 42 does not contact the first part 36a, but contacts the second part 36b without the need for widening the interval between the first and second arms 41 and 42.

Figure 4:
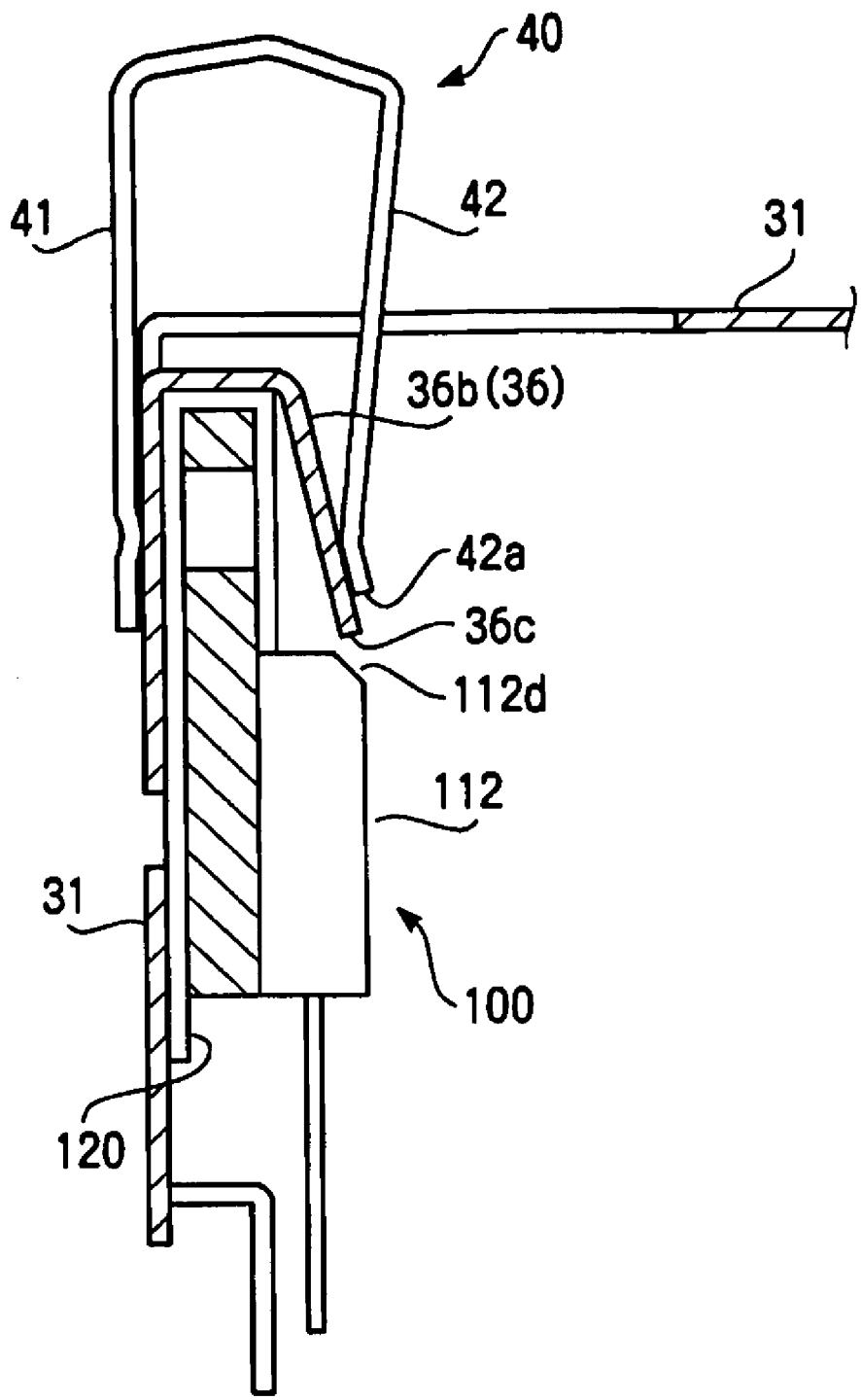
FIG. 4 is a side cross section illustrating a situation where the clip is pressed further from the state shown in FIG. 3.

By pressing downward the clip 40 from the above described state as shown in FIG. 4, the tip 42a of the second arm 42 moves along a slanting surface of the second part 36b of the guide plate 36, and thereby the interval between the first and second arms 41 and 42 is widened.

Figure 5:
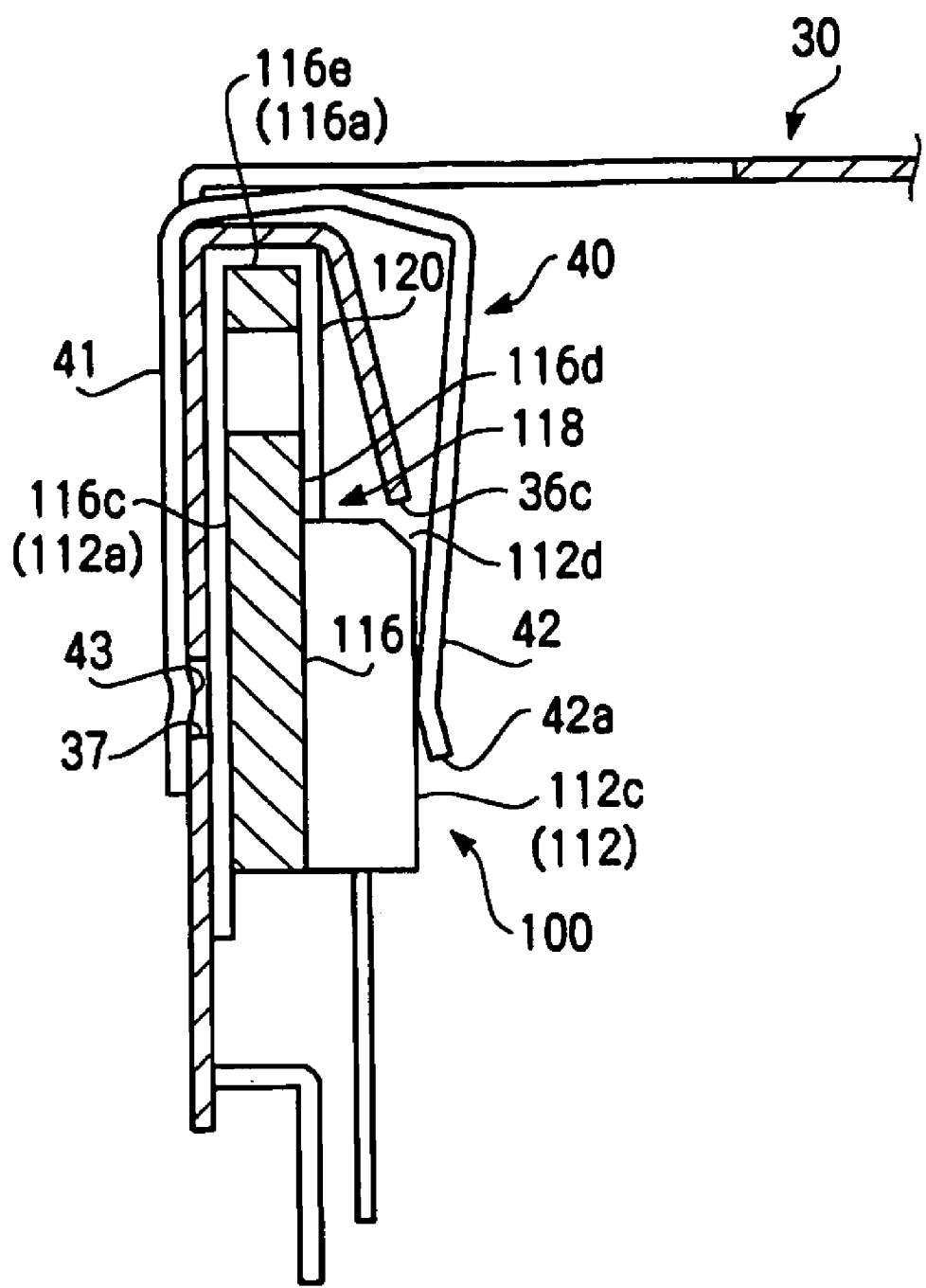
FIG. 5 is a side cross section illustrating a situation where the clip is completely fitted to the heatsink and the switching regulator in the vicinity of the guide plate.

By pressing the clip 40 further, the tip 42a of the second arm 42 moves from the guide plate 36 to the second surface 112c of the plate part 112 of the switching regulator 100. In this state, the switching regulator 100 is pressed toward the first arm 41 by a pressing force from the clip 40 (see FIG. 5). As described above, since the first side plate 32 of the heatsink body 30 is situated between the first arm 41 and the switching regulator 100, the inner surface 32a of the first side plate 32 closely contact the first surface 116c of the heat radiation plate 116 of the switching regulator 100 via the heat-conductive silicon sheet 120. As shown in FIG. 5, the interval between the edge 36c of the second part 36b of the guide plate 36 and the first side plate 32 is substantially equal to the thickness of the plate part 112 of the switching regulator 100 (i.e., the interval between the first surface 112a and the second surface 112c). Therefore, the edge 36c of the guide plate 36 is situated closely to the corner part 112d of the plate part 112 of the switching regulator 100. For this reason, the tip 42a of the second arm 42 smoothly moves from the second part 36b of the guide plate 36 to the second surface 112c of the plate part 112 without being caught by the corner part 112d.

By further pressing the clip 40 to be fitted completely, the engagement projection 43 formed at the lower tip portion of the first arm 41 falls into the clip-catching hole 37 provided in the first side plate 32 of the heatsink body 30. Since the first arm 41 presses the first side plate 32 by an elastic force of the clip 40, even if an external force is applied to the clip 40 to move the clip 40, the clip 40 can not be moved easily because in this case the engagement projection 43 is caught by the edge of the clip-catching hole 37.

By the above described process, the switching regulator 100 is attached to the heatsink body 30, and the heat radiation plate 116 closely contacts the heatsink 30 via the heat-conductive silicon sheet 120. Next, the lead terminals 114 of the switching regulator 100 which has been integrally attached to the heatsink body 30 are soldered to the connector holes 22 of the AC-DC conversion board 2 (see FIG. 1).

As describe above, in this embodiment, the entire of the exposed part of the second surface 116d of the heat radiation plate 116 of the switching regulator 100 is covered by the guide plate 36, and the second arm 42 of the clip 40 does not contact the heat-conductive silicon sheet 120 when the clip 40 is attached. Therefore, when the clip 40 is fitted to the switching regulator 100 and the heatsink 30, the heat-conductive silicon sheet 120 is prevented from being moved with the movement of the second arm 42 of the clip 40, and thereby the first surface 116c of the heat radiation plate 116 and the heatsink body 30 do not directly contact with each other. Furthermore, it is prevented that the second arm 42 contacts the heat-conductive silicon sheet 120 and that a hole is formed in the silicon sheet 120. The second arm 42 of the clip 40 is guided by the guide plate 36, and the interval between the first and second arms 41 and 42 is widened in accordance with the pressing of the clip 40. Therefore, the second arm 42 is prevented from being caught by the step part 118 of the switching regulator 100.

If each of the heatsink body 30 and the guide plate 36 is formed of a copper plate, the clip 40 is made of mild steel, these have substantially the same thickness, the length of the second arm 42 is 1.5-fold to 2-fold of the size of the guide plate 36 in the vertical direction, and the width of the guide plate 36 is set to a value larger than or equal to 1.5-fold (or preferably 2-fold) of the width of the clip 40, the flexural rigidity of the guide plate 36 becomes several-fold of the flexural rigidity of the second arm 42 of the clip 40. Therefore, even if the tip 42a of the second arm 42 moves in the vicinity of the edge 36c of the guide plate 36 with movement of the clip 40, the guide plate 36 hardly deforms, and therefore the edge 36c does not move largely toward the first surface 112a with respect to the corner part 112d. As a result, it is possible to fit the clip 40 to the heatsink body 30 and the switching regulator 100 while preventing the tip 42a of the second arm 42 from being hooked to the corner part 112d.

As described above, according to the embodiment, the notch is formed to extend from the top plate 31 to the first side plate 32 in a shape of a letter U, and the inner part of the notch is folded downward so that the opening 35 and the guide plate 36 are formed. In the conventional configuration, a rectangular or circular hole is formed in the top plate 31 by punching so that the opening 35 for inserting the second arm 42 of the clip 40 is formed. By contrast, according to the embodiment, a part of the top plate 31 is used as the guide plate 36. That is, the heatsink 3 according to the embodiment achieves the configuration where the guide plate 36 can be added without increasing the number of components.

By forming the heatsink body 30 with a metal plate so that the guide plate 36 can be formed by folding a part of the heatsink body 39, it is possible to decrease the size of the guide plate to a required minimum size for guiding the clip. Therefore, the guide plate 36 does not interfere clipping of another electronic device with a clip. The structure of the guide plate 36 also makes it possible to prevent occurrence of a situation where a part of a member such as a nut is projected to the outside of the heatsink and thereby to prevent increase of the size of the AC adapter.

Figure 6:
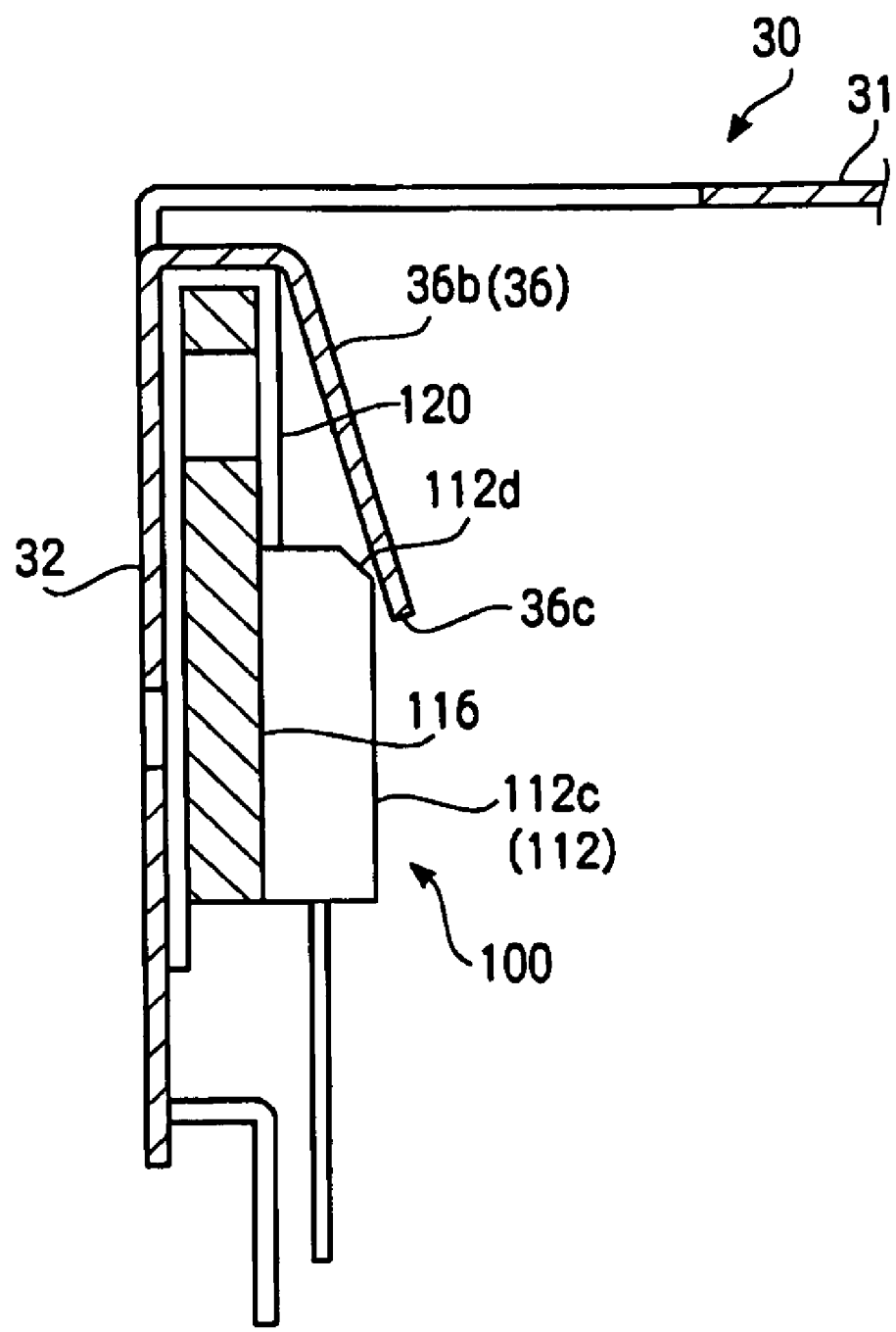
FIG. 6 is a side cross section illustrating a first variation of the guide plate.

In the above described embodiment, the edge 36c of the second part 36b of the guide plate 36 is located on the front of the corner part 112d. However, the present invention is not limited to such a configuration. As shown in FIG. 6, the edge 36c of the second part 36b of the guide plate 36 may be situated on the lower side of the corner part 112d. As in the case of the above described embodiment, the heat radiation plate 116 is covered by the second part 36b of the guide plate 36 in the configuration shown in FIG. 6. Therefore, the second arm 42 of the clip 40 is guided by the guide plate 36 and is moved to the second surface 112c of the plate part 112 without contacting the second arm 42 with the heat radiation plate 116.

Figure 7:
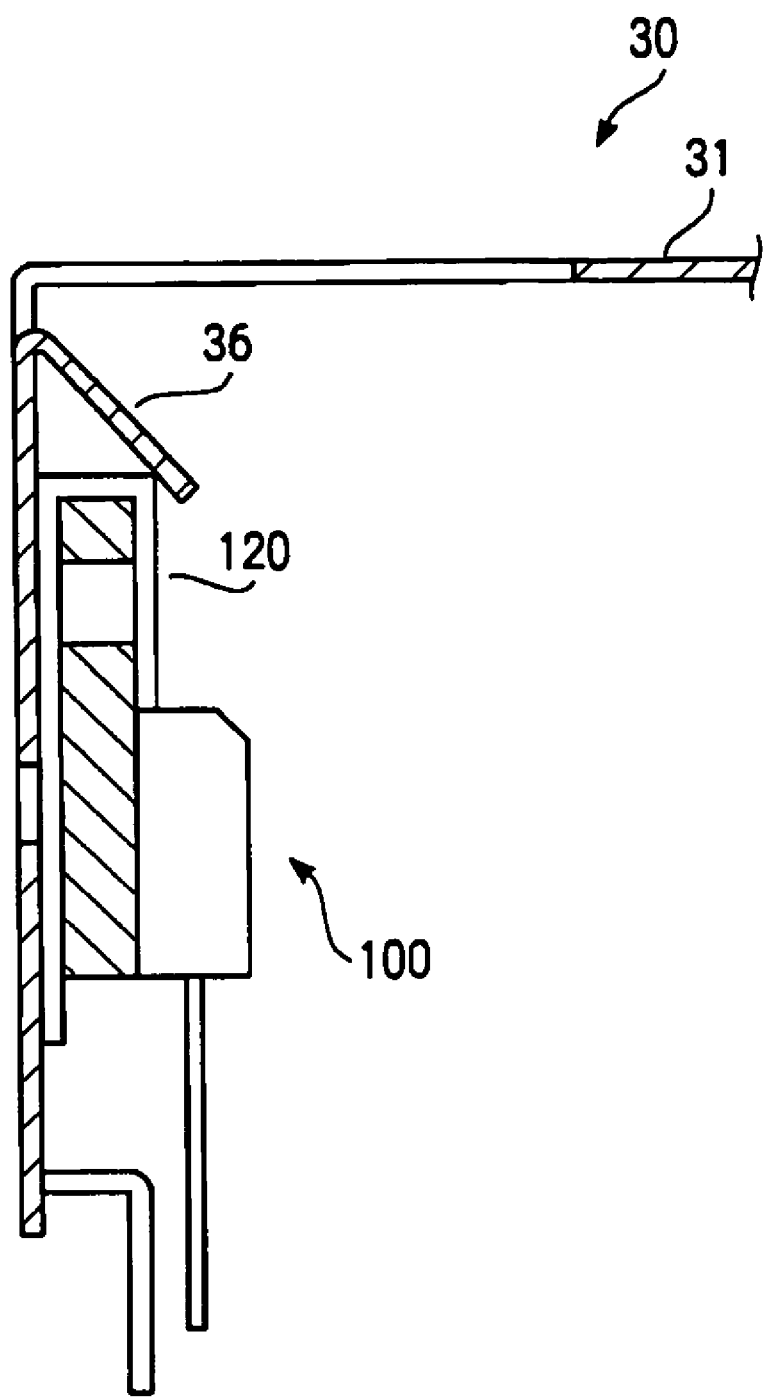
FIG. 7 is a side cross section illustrating a second variation of the guide plate.

In the above described embodiment, the notch is formed in the heatsink body 30 to have a shape of a letter U, and the inner part of the notch is folded along the fold 35b (see FIG. 1) to form the first part 36a in the direction perpendicular to the first side plate 32. Then, the front of the folded part is folded further to form the second part 36b facing the first side plate 32, so that the guide plate 36 is formed. However, the present invention is not limited to such a structure. For example, as shown in FIG. 7, the guide plate 36 may be configured by bending the heatsink body 30 in a slanting direction at the portion where a notch similar to that of the embodiment is formed to extend from the top plate 31 to the first side plate 31.

Although the present invention has been described in considerable detail with reference to certain preferred embodiments thereof, other embodiments are possible.

In the above described embodiment, the heat-conductive silicon sheet 120 is provided to prevent the electric leakage since in the embodiment heat produced from the switching regulator for the power circuit through which the larger amount of current flows should be radiated. However, in the case where heat from an electric device, such as a device having a low operational voltage or a ceramic package having a relatively high insulating property, has to be radiated, it is not necessarily required to provide the heat-conductive silicon sheet 120. The heatsink 3 according to the embodiment is also useful for an electric device which does not need the heat-conductive silicon sheet.

That is, if the heatsink 3 is used for a heat-producing device not requiring the heat-conductive silicon sheet, the clip can be widened by the guide plate. Therefore, it is possible to easily attach the clip to the heatsink body without damaging the heat-producing element.

This application claims priority of Japanese Patent Application No. 2008-095666, filed on Apr. 2, 2008. The entire subject matter of the application is incorporated herein by reference.

What is claimed is:

1. A heatsink for radiating heat from a heat-producing device, comprising:
    a heatsink body;
    a clip that has a pair of arms and is fitted to the heatsink body along a heat radiation surface of the heat-producing device such that the heat-radiation surface of the heat-producing device and the heatsink body closely contact with each other while being sandwiched between the pair of arms; and
    a guide plate integrally formed with the heatsink body,
    the guide plate being configured such that an interval between the guide plate and the heatsink body is smaller than an arm interval between the pair of arms of the clip on a front side in a fitting direction of the clip and is larger than the arm interval on a deep side in the fitting direction of the clip.

2. The heatsink according to claim 1,
wherein:
    the heatsink body is formed of a metal plate; and
    the guide plate is formed by folding a part of the heatsink body.

3. The heatsink according to claim 1,
wherein the guide plate is configured such that when the clip is fitted to the heatsink body and the heat-producing device, the guide plate is located between one of the pair of arms of the clip and a protection surface of the heat-producing device defined on a opposite side of the heat radiation surface, and does not contact the protection surface of the heat-producing device due to elastic deformation.

4. The heatsink according to claim 3,
wherein:
    the heat-producing device has a first part and a second part thicker than the first part;
    the heat-producing device further has a step formed at a boundary between the first part and the second part on the opposite side of the heat radiation surface;
    the protection surface is defined on an opposite side of the first part of the heat-producing device; and
    when the heat-producing device is placed such that the first part faces the front side in the fitting direction of the clip, a top edge of the guide plate in the fitting direction is positioned close to a corner of the step of the heat-producing device.

5. The heatsink according to claim 4, wherein the guide plate covers substantially an entire area defined on the opposite side of the heat-radiation surface in the first part of the heat-producing device.

6. The heatsink according to claim 1, wherein the guide plate is formed by forming a notch in the heatsink body to have a form of a letter U and folding an inner part of the notch.

7. The heatsink according to claim 1, wherein:
- the heatsink body has a clip hole at a portion contacting a plate part of the heat-producing device; and
- the clip has an engagement projection which engages with the clip hole of the heatsink body in a state where the clip is fitted to the heatsink body.

* * * * *